(12) United States Patent
Kumashikar et al.

(10) Patent No.: US 12,341,511 B2
(45) Date of Patent: Jun. 24, 2025

(54) POWER MANAGEMENT USING VOLTAGE ISLANDS ON PROGRAMMABLE LOGIC DEVICES

(71) Applicant: Intel Corporation, Santa Clara, CA (US)

(72) Inventors: Mahesh K. Kumashikar, Bangalore (IN); Ankireddy Nalamalpu, Portland, OR (US); Md Altaf Hossain, Portland, OR (US); Dheeraj Subbareddy, Portland, OR (US); Atul Maheshwari, Portland, OR (US); Yuet Li, Fremont, CA (US); Mahesh A. Iyer, Fremont, CA (US)

(73) Assignee: Altera Corporation, San Jose, CA (US)

( * ) Notice: Subject to any disclaimer, the term of this patent is extended or adjusted under 35 U.S.C. 154(b) by 583 days.

(21) Appl. No.: 17/559,287

(22) Filed: Dec. 22, 2021

(65) Prior Publication Data

US 2022/0116041 A1     Apr. 14, 2022

(51) Int. Cl.
*H03K 19/177*     (2020.01)
*H03K 19/17784*   (2020.01)

(52) U.S. Cl.
CPC ................... *H03K 19/177* (2013.01)

(58) Field of Classification Search
None
See application file for complete search history.

(56) References Cited

U.S. PATENT DOCUMENTS

| | | | |
|---|---|---|---|
| 6,034,536 A * | 3/2000 | McClintock | H03K 19/17736 326/38 |
| 10,833,679 B2 | 11/2020 | Clark et al. | |
| 2003/0072185 A1* | 4/2003 | Lane | H03K 19/17736 365/230.02 |
| 2016/0049941 A1* | 2/2016 | How | H03K 19/17728 326/38 |
| 2022/0116042 A1* | 4/2022 | Maheshwari | H03K 19/177 |

* cited by examiner

*Primary Examiner* — Anh Q Tran
(74) *Attorney, Agent, or Firm* — Fletcher Yoder, P.C.

(57) ABSTRACT

Systems or methods of the present disclosure may provide efficient electric power consumption of programmable logic devices based on providing different voltage levels to different portions (e.g., voltage islands) of the programmable logic device. For example, the programmable logic device may include circuitry to provide different voltage levels to different voltage islands. The programmable logic device may implement and operate logic configurations with different operating parameters using different operating voltages for efficient electric power consumption.

20 Claims, 6 Drawing Sheets

POWER MANAGEMENT USING VOLTAGE ISLANDS ON PROGRAMMABLE LOGIC DEVICES

BACKGROUND

The present disclosure relates generally to programmable logic devices. More particularly, the present disclosure relates to electronic power consumption management of the programmable logic devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

An electronic device may include a programmable logic device including programmable circuitry. For example, the programmable logic device may be programmed to implement one or more logic designs. Moreover, the programmable logic device may perform one or more operations using the implemented logic designs. As such, the electronic device may use the programmable logic devices to perform operations based on the implemented logic designs.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
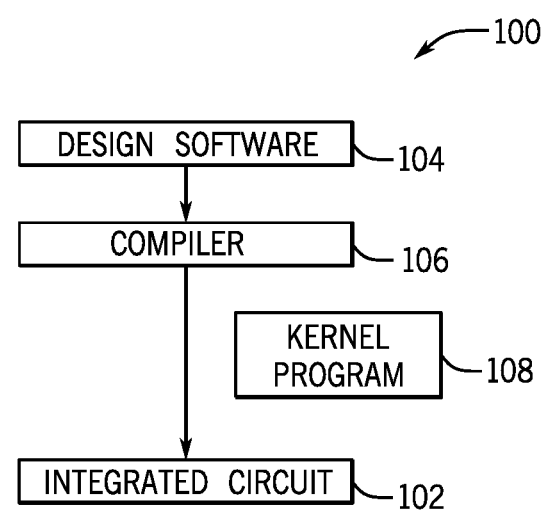
FIG. 1 is a block diagram of a process for programming an integrated circuit including a programmable fabric, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure describes systems and techniques related to electric power consumption of programmable logic devices. In particular, the embodiments described herein are directed to efficient power consumption of a programmable logic device based on providing different voltage levels to different portions (e.g., voltage islands) of the programmable logic device. For example, the programmable logic device may include circuitry to provide different voltage levels to different voltage islands.

The programmable logic device may include programmable logic sectors distributed in rows and columns. In some cases, the programmable logic device may be programmed to implement a logic configuration for performing a desired function during operation. The programmable logic device may implement the logic configuration on programmable logic elements of the programmable logic sectors. In some cases, the logic circuit may operate according to a number of operating parameters. In specific cases, the operating parameters of the logic circuit may correspond to an operating voltage of the logic circuit. In one example, a lower operating frequency of the logic circuit may correspond to a lower operating voltage.

With that in mind, the programmable logic device may include one or more redundancy logic circuits disposed between one or more rows and/or columns of the programmable logic sectors. A redundancy logic circuit may include a number of multiplexers (MUX) and level shifters. The redundancy logic circuit may be used to remap rows or columns of the programmable logic circuit using MUXs or other selection circuitry when there is a failure. The redundancy logic circuit may also include level shifters to provide different voltage levels to different voltage islands of the programmable logic device. In some cases, the redundancy logic circuit may provide different voltage levels to different sides of the redundancy logic circuit (e.g., left and right, up and down) using the level shifters and/or the MUXs. In other cases, the redundancy logic circuit may provide different voltage levels to different voltage islands including different number of programmable logic sectors with similar or different levels of granularity (and/or voltage island architecture).

Moreover, in some cases, the programmable logic device may implement different logic configurations with different operating parameters (e.g., operating voltages) on different voltage islands. As mentioned above and described in more details below, the programmable logic device may provide different voltage levels to the different voltage islands using the redundancy logic circuit. Accordingly, the logic configurations implemented on different voltage islands may perform the associated/desired functions using different voltage levels during operation of the programmable logic device. For instance, these different voltage levels may be set using design software where different programmable logic in different voltage islands may be operate using different voltage levels for which the respective programmable logic is optimized for the different voltage levels.

In some cases, the programmable logic device may use the level shifters of the redundancy logic circuit to provide a voltage level lower than a maximum or default voltage level of the programmable logic device to at least one of the voltage islands during operation. In specific cases, the programmable logic device may use the level shifters to provide multiple voltage levels lower than the maximum or default voltage level of the programmable logic device to multiple voltage islands during operation. Accordingly, in such cases, the programmable logic device may draw lower electric power during operation based on providing multiple voltage levels to different voltage islands using the redundancy logic circuit while maintaining efficient performance by optimizing the programmable logic on the different voltage islands for the provided voltage level.

An integrated circuit may utilize one or more programmable logic devices (e.g., programmable fabrics, FPGAs). FIG. 1 illustrates a block diagram of a system 100 used to configure a programmable device. A designer may implement functionality on an integrated circuit, such as an integrated circuit 102 that includes some reconfigurable circuitry, such as an FPGA. A designer may implement a circuit configuration (e.g., logic circuitry) to be programmed onto the integrated circuit 102 using design software 104, such as a version of Quartus by Altera™. The design software 104 may use a compiler 106 to generate a low-level circuit-design, which may be provided as a kernel program 108, sometimes known as a program object file or bitstream, that programs the integrated circuit 102. That is, the compiler 106 may provide machine-readable instructions representative of the circuit design to the integrated circuit 102.

Figure 2:
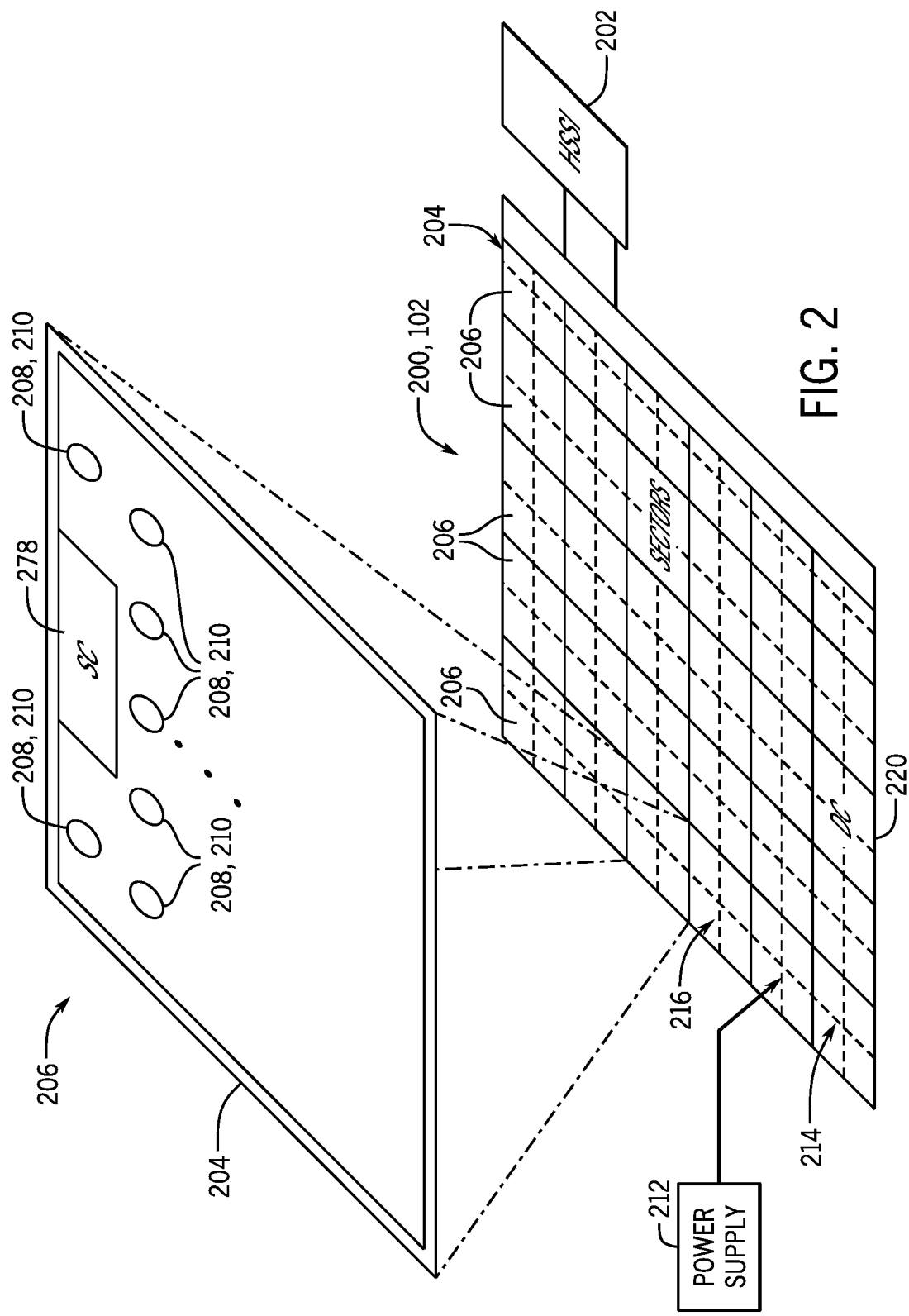
FIG. 2 is a diagram of the programmable fabric of FIG. 1, in accordance with an embodiment of the present disclosure.

The integrated circuit 102 may include any programmable logic device, such as a field programmable gate array (FPGA) 200, as shown in FIG. 2. For the purposes of this example, the FPGA 200 is referred to as an FPGA, though it should be understood that the device may be any suitable type of programmable logic device (e.g., an application-specific integrated circuit and/or application-specific standard product). In one example, the FPGA 200 is a sectorized FPGA of the type described in U.S. Patent Publication No. 2016/0049941, "Programmable Circuit Having Multiple Sectors," which is incorporated by reference in its entirety for all purposes. The FPGA 200 may be formed on a single plane. Additionally or alternatively, the FPGA 200 may be a three-dimensional FPGA having a base die and a fabric die of the type described in U.S. Pat. No. 10,833,679, "Multipurpose Interface for Configuration Data and User Fabric Data," which is incorporated by reference in its entirety for all purposes.

In the example of FIG. 2, the FPGA 200 may include transceiver 202 that may include and/or use input-output circuitry for driving signals off the FPGA 200 and for receiving signals from other devices. Interconnection resources 204 may be used to route signals, such as clock or data signals, through the FPGA 200. The FPGA 200 of FIG. 2 is sectorized, meaning that programmable logic resources may be distributed through a number of discrete programmable logic sectors 206. Each programmable logic sector 206 may include a number of programmable logic elements 208 having operations defined by configuration memory 210 (e.g., configuration random access memory (CRAM)). In some cases, the FPGA 200 may include a number of voltage islands. In such cases, each voltage island may include a number of programmable logic sectors 206.

The programmable logic elements 208 may include (e.g., implement) combinational or sequential logic circuitry. For example, the programmable logic elements 208 may include look-up tables, registers, multiplexers, routing wires, and so forth. A designer may program the programmable logic elements 208 to perform a variety of desired functions. A power supply 212 may provide a source of voltage (e.g., supply voltage) and current to a power distribution network (PDN) 214 that distributes electrical power to the various components of the FPGA 200. Operating the circuitry of the FPGA 200 causes power to be drawn from the power distribution network 214.

Moreover, in some cases, the FPGA 200 may include one or more redundancy logic circuits 216 disposed between one or more rows and/or columns of the programmable logic sectors 206. The redundancy logic circuit 216 may include multiple level shifters and MUXs. In some cases, the power distribution network 214 may provide the electrical power to the level shifters and MUXs of the redundancy logic circuit 216. Moreover, in some cases, the redundancy logic circuit 216 may use the level shifters and MUXs to provide multiple voltage levels to different voltage islands of the FPFA 200. In specific cases, the redundancy logic circuit 216 may use different voltage rails and/or voltage pins to provide different voltage levels to the voltage islands of the FPGA 200.

For example, the redundancy logic circuit 216 may use a level shifter to provide a stepped-down voltage level of a voltage received from the power supply 212. Moreover, in some cases, the redundancy logic circuit 216 may receive control bits including instructions for selecting the stepped-down voltage level or the voltage received from the power supply 212. For example, the level shifters may provide a voltage level to one or multiple voltage islands based on receiving the control bits. Accordingly, the redundancy logic circuit 216 may use the level shifters to provide different voltage levels to different voltage islands during operation of the FPGA 200. As such, in some cases, the redundancy logic circuit 216 may efficiently use lower electric power based on providing the stepped-down voltage level of the power supply 212 to at least a portion of the FPGA 200 (e.g., at least one voltage island) during operation.

In some embodiments, the redundancy logic circuit 216 may provide different voltage levels to different sides of the redundancy logic circuit 216 (e.g., left and right, up and down). In such embodiments, the different sides of the redundancy logic circuit 216 may correspond to different voltage islands (e.g., a first voltage island and a second voltage island) of the FPGA 200. For example, the FPGA 200 may implement different logic configurations operating according to the different voltage levels on different sides of the redundancy logic circuit 216. Accordingly, the FPGA 200 may efficiently draw less electrical power during operation based on using the redundancy logic circuit 216.

That said, it should be appreciated that in alternative or additional embodiments, the FPGA 200 may include voltage islands with different architecture or different combination of programmable logic sectors 206. For example, the voltage islands may include different combination of programmable logic sectors 206 with similar or different number of programmable logic sectors 206. In some cases, the FPGA 200 may include specific voltage rails and/or voltage vias for providing specific voltage levels (e.g., voltage domains) provided by the redundancy logic circuit 216 to such voltage islands. For example, the redundancy logic circuit 216 may provide the specific voltage levels to the respective voltage islands using the respective voltage rails and/or voltage vias.

In any case, there may be any suitable number of programmable logic sectors 206 on the FPGA 200. Indeed, while 29 programmable logic sectors 206 are shown here, it should be appreciated that more or fewer may appear in an actual implementation (e.g., in some cases, on the order of 50, 100, 500, 1000, 5000, 10,000, 50,000, or 100,000 sectors or more). Each programmable logic sector 206 may include a sector controller (SC) 218 that controls the operation of the programmable logic sector 206. Each sector controller 218 may be in communication with a device controller (DC) 220.

Each sector controller 218 may accept commands and data from the device controller 220 and may read data from and write data into its configuration memory 210 based on control signals from the device controller 220. In addition to these operations, the sector controller 218 may be augmented with numerous additional capabilities. For example, such capabilities may include locally sequencing reads and writes to implement error detection and correction on the configuration memory 210 and sequencing test control signals to effect various test modes.

The sector controllers 218 and the device controller 220 may be implemented as state machines and/or processors. For example, each operation of the sector controllers 218 or the device controller 220 may be implemented as a separate routine in a memory containing a control program. In some cases, the sector controllers 218 may generate and/or provide the control bits to one or multiple components of the FPGA, such as the level shifters. This control program memory may be fixed in a read-only memory (ROM) or stored in a writable memory, such as random-access memory (RAM).

The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 206. This may provide usable extensibility in an efficient and easily understood way. This may be useful because new commands could bring about large amounts of local activity within the sector at the expense of only a small amount of communication between the device controller 220 and the sector controllers 218.

Each sector controller 218 thus may communicate with the device controller 220, which may coordinate the operations of the sector controllers 218 and convey commands initiated from outside the FPGA 200. To support this communication, the interconnection resources 204 may act as a network between the device controller 220 and each sector controller 218. The interconnection resources may support a wide variety of signals between the device controller 220 and each sector controller 218. In one example, these signals may be transmitted as communication packets.

The FPGA 200 may be electrically programmed. With electrical programming arrangements, the programmable logic elements 208 may include one or more logic elements (wires, gates, registers, etc.). For example, during programming, configuration data is loaded into the configuration memory 210 using pins and input/output circuitry. In one example, the configuration memory 210 may be implemented as configuration random-access-memory (CRAM) cells. As discussed below, in some embodiments, the configuration data may be loaded into the FPGA 200 using an update to microcode of the processor in which the FPGA 200 is embedded.

The use of configuration memory 210 based on RAM technology is described herein is intended to be only one example. Moreover, configuration memory 210 may be distributed (e.g., as RAM cells) throughout the various programmable logic sectors 206 the FPGA 200. The configuration memory 210 may provide a corresponding static control output signal that controls the state of an associated programmable logic element 208 or programmable component of the interconnection resources 204. The output signals of the configuration memory 210 may be applied to the gates of metal-oxide-semiconductor (MOS) transistors that control the states of the programmable logic elements 208 or programmable components of the interconnection resources 204.

The sector controllers 218 and/or the device controller 220 may determine when each sector controller 218 performs a CRAM read operation on the configuration memory 210 of its programmable logic sector 206. Each time the sector controller 218 performs a CRAM read of the configuration memory 210, power is drawn from the power distribution network 214. If too much power is drawn from the power distribution network 214 at any one time, the voltage provided by the power distribution network 214 could drop to an unacceptably low level, or too much noise could arise on the power distribution network 214. To avoid this, the device controller 220 and/or the sector controllers 218 may structure CRAM reads of the programmable logic sectors 206 to avoid excessive instantaneous power consumption by temporally and/or spatially distributing the CRAM reads across different programmable logic sectors 206.

The sector controller 218 of the programmable logic sector 206 is shown to read and write to the configuration memory 210 by providing an ADDRESS signal to an address register and providing a memory write signal (WRITE), a memory read signal (RD DATA), and/or the data to be written (WR DATA) to a data register. These signals may be used to cause the data register to write data to or read data from a line of configuration memory 210 that has been activated along an address line, as provided by the ADDRESS signal applied to the address register. Memory read/write circuitry may be used to write data into the activated configuration memory 210 cells when the data register is writing data and may be used to sense and read data from the activated configuration memory 210 cells when the data register is reading data.

Figure 3A:
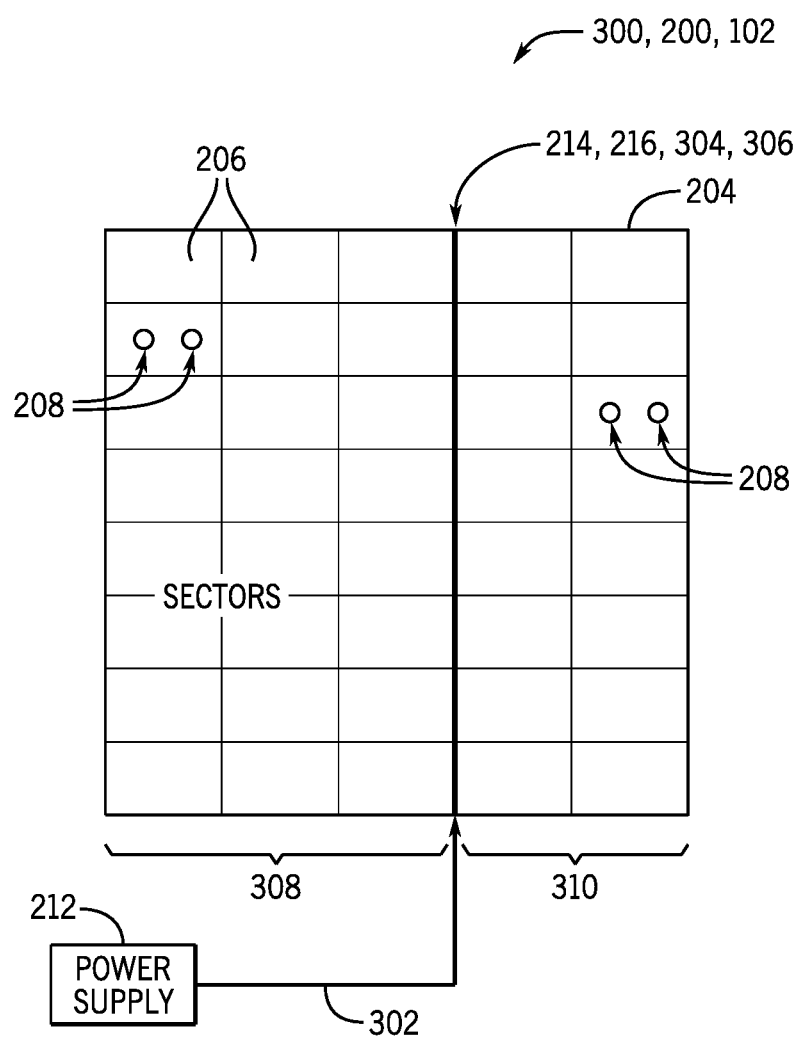
FIG. 3A is a diagram of the programmable fabric of FIG. 1 depicting redundancy logic circuitry disposed between programmable logic sectors of the programmable fabric of FIG. 1, in accordance with an embodiment of the present disclosure.

With the foregoing in mind, FIG. 3A depicts a programmable logic device 300 including the redundancy logic circuit 216. In some cases, the integrated circuit 102 and/or the FPGA 200 may include the programmable logic device 300. Moreover, the programmable logic device 300 may include the programmable logic sectors 206 communicatively coupled to the interconnection resources 204.

The programmable logic device 300 may be coupled the power supply 212. In some cases, the programmable logic device 300 may include the power supply 212. In alternative or additional cases, the power supply 212 may be disposed outside the programmable logic device 300. In any case, the power supply 212 may supply electrical power to the power distribution network 214. The power supply 212 may provide the electrical power using a supply voltage 302 to the power distribution network 214.

In turn, the power distribution network 214 may provide the supply voltage 302 to the redundancy logic circuit 216.

In some cases, the power distribution network 214 may provide the supply voltage 302 to different distributed portions of the redundancy logic circuit 216 along a row and/or column of programmable logic sectors 206. Moreover, in some embodiments, the power distribution network 214 may include and/or utilize the redundancy logic circuit 216 to aid in the distribution of power. In alternative or additional embodiments, the power distribution network 214 may be disposed separately from the redundancy logic circuit 216.

In any case, the redundancy logic circuit 216 may provide one or multiple voltage levels (e.g., voltage domains) to different portions of the programmable logic device 300 based on receiving the supply voltage 302. In some cases, the redundancy logic circuit 216 may remap rows or columns of the programmable logic elements 208 of the programmable logic sectors 206 to use a redundant row or column of programmable logic elements in a repair.

With the foregoing in mind, the redundancy logic circuit 216 may include MUX circuitry 304 or a number of MUXs 304 (e.g., MUX components) to perform the remapping. In some cases, the redundancy logic circuit 216 may also include a number of level shifters 306. In additional or alternative cases, the redundancy logic circuit 216 may include one or more voltage regulators and/or voltage converters in lieu of or additional to the level shifters 306. In some embodiments, the MUXs 304 and/or the level shifters 306 may be programmable using the design software 104, the compiler 106, and/or the kernel program 108 of FIG. 1 to provide adjusted voltage levels. In specific embodiments, the MUXs 304 and/or the level shifters 306 may be programmed using control bits (from a respective controller) to provide one or multiple stepped-down voltage levels. Accordingly, in such cases, the MUXs 304 and/or the level shifters 306 may provide the one or multiple stepped-down voltage levels based on receiving the supply voltage 302 and a configuration of the programmable logic elements 208.

The level shifters 306 (e.g., and/or the one or more voltage regulators and/or voltage converters) may provide the multiple voltage levels based on receiving the supply voltage 302. In some cases, one or more of the level shifters 306 may step-down (e.g., down-convert) a voltage level of the supply voltage 302. In some embodiments, a single voltage may be output from each level shifter to a voltage domain/island. For example, one or more of the level shifters 306 may receive the control bits (or a portion of the control bits) to adjust and/or provide a specific stepped-down voltage level. Moreover, in some cases, the MUXs 304 may receive the control bits (or a portion of the control bits) to perform the remapping of the programmable logic elements 208.

In the depicted embodiment, the programmable logic device 300 may include a first voltage island 308 and a second voltage island 310. For example, the first voltage island 308 may include the programmable logic sectors 206 disposed on a first side of the redundancy logic circuit 216. That is, the first island 308 may include a first portion of the programmable logic sectors 206. Moreover, the second voltage island 310 may include the programmable logic sectors 206 disposed on a second side of the redundancy logic circuit 216. That is, the second island 310 may include a second portion of the programmable logic sectors 206.

Accordingly, the redundancy logic circuit 216 is disposed between a first portion of programmable logic sectors (e.g., the first voltage island 308) and a second portion of programmable logic sectors (e.g., the second voltage island 310) of the programmable logic device 300. That said, it should be appreciated that in alternative or different embodiments, the programmable logic device 300 may include a different number of voltage islands and/or voltage islands with different architecture and/or with different numbers of redundancy logic circuits 216.

Moreover, in some cases, the programmable logic device 300 may include a number of voltage rails and/or voltage vias. In such cases, the redundancy logic circuit 216 may provide the multiple voltage levels to the programmable logic elements 208 of the programmable logic sectors 206 via the voltage rails and/or voltage vias. In some cases, the interconnection resources 204 may include the voltage rails and/or voltage vias for routing voltage signals. In different embodiments, such voltage rails may be implemented using fully-integrated voltage regulators (FIVR) on a die of the programmable logic device 300, using voltage regulator (VR) chiplets, using power management integrated circuits (PMICs), using board VR, among other things. For instance, at least some of the level shifters 306 may be implemented using FIVR or another VR technique.

In specific cases, the first voltage island 308 and the second voltage island 310 may each include a number of the programmable logic sectors 206 electrically connected to respective voltage rails and/or voltage vias. In such cases, the redundancy logic circuit 216 may provide the respective voltage levels to the first voltage island 308 and the second voltage island 310 using the respective voltage rails and/or voltage vias. Moreover, in some embodiments, at least some of the MUXs 304 may selectively provide different voltage levels to the first voltage island 308 and the second voltage island 310 via the respective voltage rails and/or voltage vias.

Figure 3B:
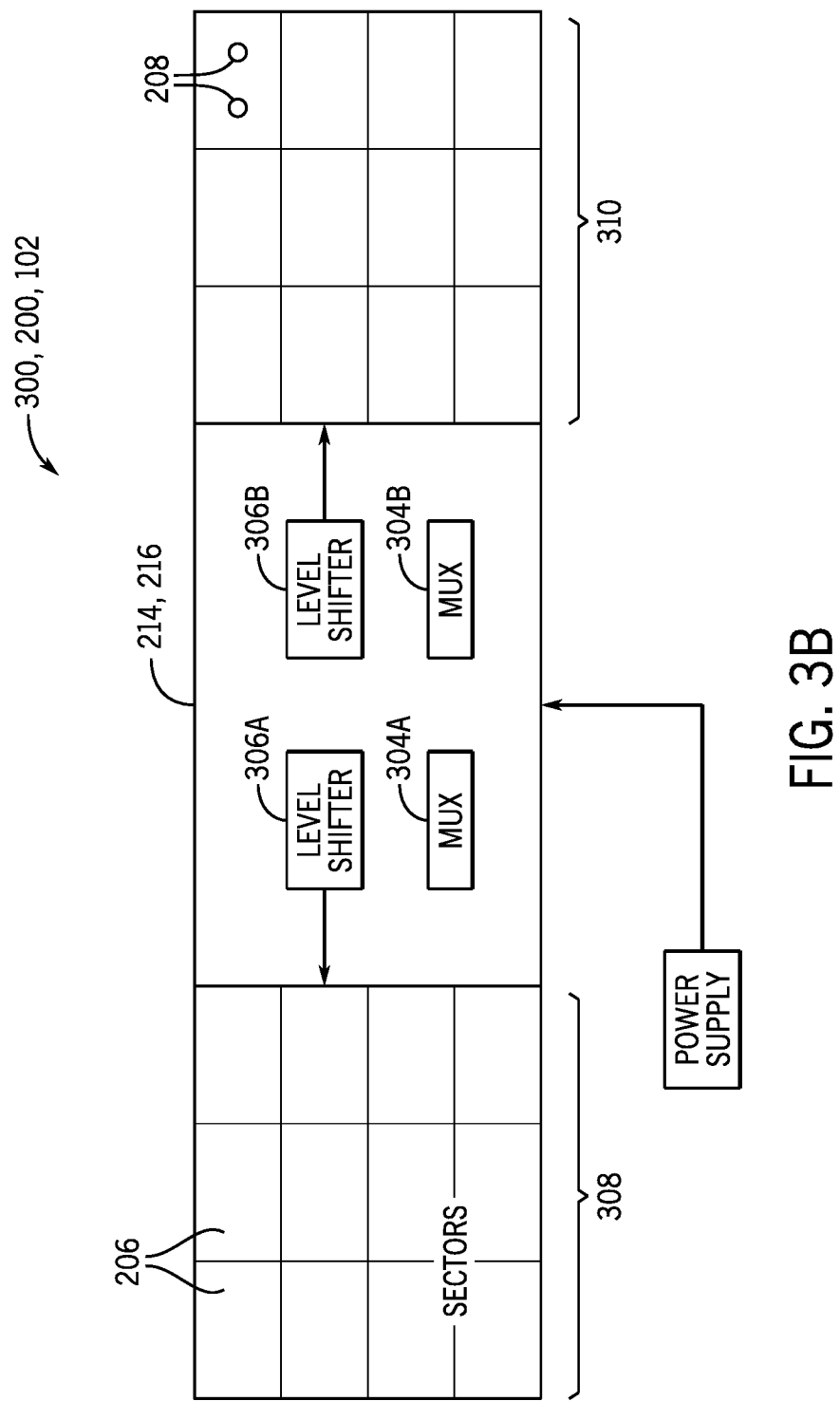
FIG. 3B is a diagram of the programmable fabric of FIG. 1 depicting a level shifter and MUX block of the redundancy logic circuitry, in accordance with an embodiment of the present disclosure.

FIG. 3B depicts block diagrams of a first level shifter 306A, a second level shifter 306B, a first MUX 304A, and a second MUX 304B of the redundancy logic circuit of FIG. 3A. Although certain circuitry is depicted in FIG. 3B, it should be appreciated that FIG. 3B is associated with only a portion of the redundancy logic circuit 216. Moreover, although the first voltage island 308 and the second voltage island 310 are depicted using a specific number of rows, in different embodiments, the first voltage island 308 and the second voltage island 310 may include a different number of rows and/or columns.

In the depicted embodiment, the level shifter 306A may receive the supply voltage 302 of the power supply 212 and the control bits (or a portion of the control bits). In some cases, the level shifter 306A may step-down the supply voltage 302 to a first voltage based on the control bits. Moreover, the level shifter 306A may provide the first voltage to the first voltage island 308. For example, the level shifter 306A may provide the first voltage to the first voltage island 308 based on instructions included with the control bits. In alternative or additional embodiments, the level shifter 306A may provide the first voltage to the second voltage island 310.

Furthermore, the level shifter 306B may also receive the supply voltage 302 of the power supply 212 and the control bits (or a portion of the control bits). In some cases, the level shifter 306B may step-down the supply voltage 302 to a second voltage based on the control bits. In the depicted embodiment, the level shifter 306B may provide the second voltage to the second voltage island 310. For example, the level shifter 306B may provide the second voltage to the second voltage island 310 based on instructions included with the control bits. In alternative or additional embodiments, the level shifter 306B may provide the second voltage to the first voltage island 308 and/or other portions of the programmable logic device 300.

Figure 4:
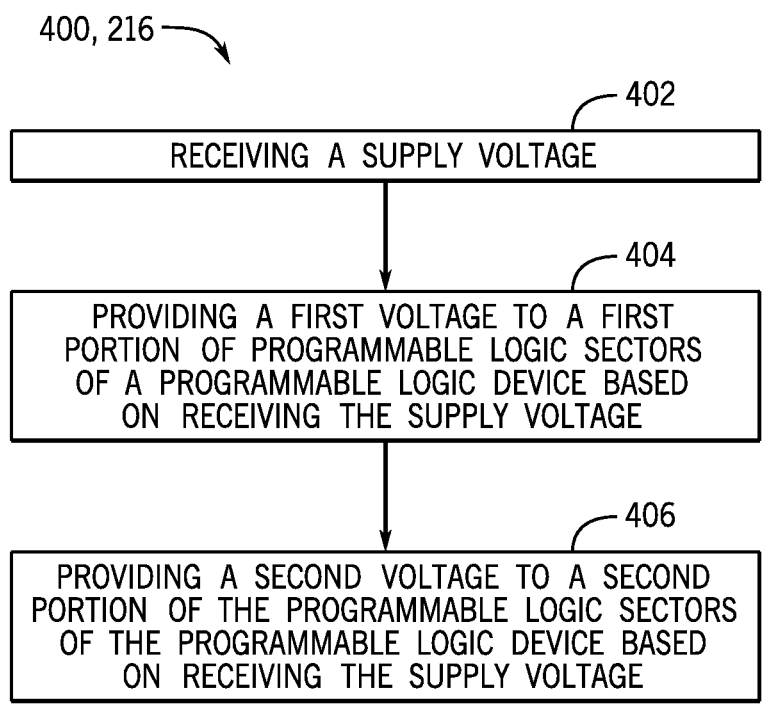
FIG. 4 is a process for providing multiple voltage levels to different portions of the programmable fabric of FIG. 1, in accordance with an embodiment of the present disclosure.

Referring to FIG. 4, a process 400 for providing multiple voltage levels to different portions of the programmable logic sectors 206 is described. For example, the process 400 may be associated with providing different voltage levels to the first voltage island 308 and the second voltage island 310 of the programmable logic device 300 described above. Moreover, in some cases, the redundancy logic circuit 216 may use the level shifters and/or MUXs described above to perform the process 400.

At block 402, the redundancy logic circuit 216 may receive a supply voltage. For example, the redundancy logic circuit 216 may receive the supply voltage 302. Moreover, in some cases, the redundancy logic circuit 216 may receive the supply voltage via the power distribution network 214.

At block 404, the redundancy logic circuit 216 may provide a first voltage to a first portion of programmable logic sectors of a programmable logic device based on receiving the supply voltage. In one example, the redundancy logic circuit 216 may use the level shifters 306 to provide the first voltage to the first voltage island 308 based on adjusting the first voltage based on the control bits. For example, the level shifters 306 may adjust the first voltage based on receiving the control bits.

Moreover, at block 406, the redundancy logic circuit 216 may provide a second voltage to a second portion of the programmable logic sectors of the programmable logic device based on receiving the supply voltage. In one example, the redundancy logic circuit 216 may use the level shifters 306 to provide the second voltage to the second voltage island 310 where the second voltage is either the same as the supply voltage or another voltage different than the first voltage. When the second voltage is different than the supply voltage, the level shifters 306 may adjust the second voltage from the supply voltage. For example, the level shifters 306 may adjust the second voltage based on receiving the control bits.

In some cases, the redundancy logic circuit 216 may step-down (e.g., down-convert) the supply voltage to provide the first voltage, the second voltage, or both. For example, the redundancy logic circuit 216 may use the level shifters 306 to step-down the supply voltage to generate the first and/or second voltage. As mentioned above, the level shifters may receive control bits including instructions for generating the first and/or second voltage. Moreover, in some embodiments, the redundancy logic circuit 216 may use the control bits to select the stepped-down voltage or the supply voltage. Furthermore, in alternative or additional embodiments, the redundancy logic circuit 216 may provide additional voltages using different voltage levels (e.g., a third voltage, a fourth voltage, etc.) to different portions of the programmable logic device (e.g., a third voltage island, a fourth voltage island, etc.). In such embodiments, the redundancy logic circuit 216 may be implemented in multiple locations each with power islands on both sides of each redundancy logic circuit 216 locations.

Figure 5:
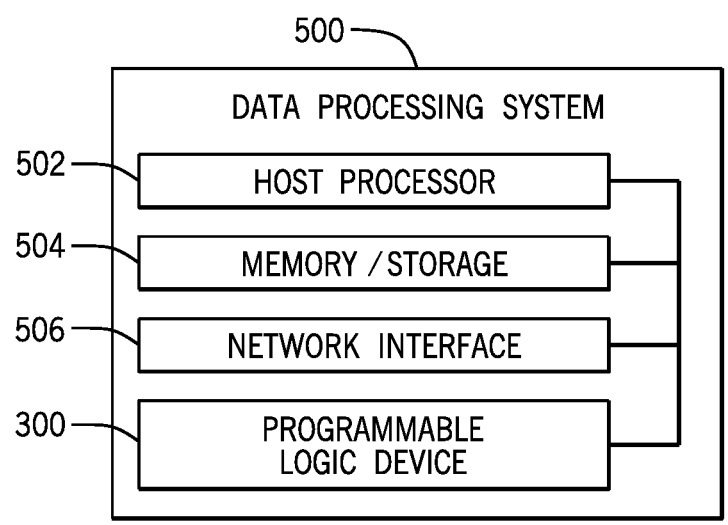
FIG. 5 is a block diagram of a data processing system including a processor with an integrated programmable fabric unit, in accordance with an embodiment of the present disclosure.

Bearing the foregoing in mind, the programmable fabric with multiple power islands implemented in a may be integrated into a data processing system or may be a component included in a data processing system, such as a data processing system 500, shown in FIG. 5. The data processing system 500 may include a host processor 502, memory and/or storage circuitry 504, and a network interface 506. The data processing system 500 may include more or fewer components (e.g., electronic display, user interface structures, application specific integrated circuits (ASICs)).

The host processor 502 may include any suitable processor, such as a central processing unit, microprocessor, graphics processing unit, etc., that may manage a data processing request for the data processing system 500 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 504 may include random access memory (RAM), read-only memory (ROM), one or more hard drives, flash memory, or the like.

The memory and/or storage circuitry 504 may hold data to be processed by the data processing system 500. In some cases, the memory and/or storage circuitry 504 may also store configuration programs (bitstreams) for programming a programmable logic device 300. As mentioned above, in different embodiments, the programmable logic device 300 may include the integrated circuit 102 and/or the FPGA 200.

The network interface 506 may allow the data processing system 500 to communicate with other electronic devices. The data processing system 500 may include several different packages or may be contained within a single package on a single package substrate. For example, components of the data processing system 500 may be located on several different packages at one location (e.g., a data center) or multiple locations. For instance, components of the data processing system 500 may be located in separate geographic locations or areas, such as cities, states, or countries.

In one example, the data processing system 500 may be part of a data center that processes a variety of different requests. For instance, the data processing system 500 may receive a data processing request via the network interface 506 to perform encryption, decryption, machine learning, video processing, voice recognition, image recognition, data compression, database search ranking, bioinformatics, network security pattern identification, spatial navigation, digital signal processing, or some other specialized task.

EXAMPLE EMBODIMENTS

EXAMPLE EMBODIMENT 1. A programmable logic device, comprising:
  a plurality of programmable logic sectors, wherein each programmable logic sector comprises at least one programmable logic element;
  a redundancy logic circuit coupled to the programmable logic sectors for providing a first voltage to a first portion of the programmable logic sectors of the plurality of programmable logic sectors and a second voltage to a second portion of the programmable logic sectors of the plurality of programmable logic sectors, wherein the redundancy logic circuit comprises:
    a first level shifter that receives a supply voltage and steps-down the supply voltage to the first voltage; and
    multiplexer circuitry that comprises a first multiplexer that remaps logic of a first programmable logic element of the at least one programmable logic element associated with the first portion of the programmable logic sectors to utilize a redundant programmable logic element using the first voltage.

EXAMPLE EMBODIMENT 2. The programmable logic device of example embodiment 1, wherein the multiplexer circuitry comprises a second multiplexer that selects the supply voltage for providing the second voltage to the second portion of the programmable logic sectors.

EXAMPLE EMBODIMENT 3. The programmable logic circuit of example embodiment 1, wherein the first level shifter receive control bits and steps-down the supply voltage to the first voltage based on the control bits.

EXAMPLE EMBODIMENT 4. The programmable logic circuit of example embodiment 1, wherein:
the redundancy logic circuit comprises a second level shifter that receives the supply voltage and control bits; steps-down the supply voltage to the second voltage based on the control bits; and
the multiplexer circuitry remaps logic of a second programmable logic element of the at least one programmable logic element associated with the second portion of the programmable logic sectors to utilize a redundant programmable logic element using the second voltage.

EXAMPLE EMBODIMENT 5. The programmable logic circuit of example embodiment 1, comprising a first voltage rail that provides the first voltage to the first portion of the programmable logic sectors and a second voltage rail that provides the second voltage to the second portion of the programmable logic sectors.

EXAMPLE EMBODIMENT 6. The programmable logic circuit of example embodiment 1, wherein the programmable logic elements of the first portion of the programmable logic sectors implement at least a first logic configuration, and the programmable logic elements of the second portion of the programmable logic sectors implement at least a second logic configuration.

EXAMPLE EMBODIMENT 7. The programmable logic circuit of example embodiment 6, wherein the first logic configuration performs functions using the first voltage, and the second logic circuitry performs functions using the second voltage.

EXAMPLE EMBODIMENT 8. A method comprising:
receiving, by a redundancy logic circuit that performs repairs for a programmable logic device and from a power supply, a supply voltage;
providing, via the redundancy logic circuit, a first voltage to a first portion of programmable logic sectors of a plurality of programmable logic sectors of the programmable logic device based on receiving the supply voltage; and
providing, via the redundancy logic circuit, a second voltage to a second portion of programmable logic sectors of the plurality of programmable logic sectors based on receiving the supply voltage.

EXAMPLE EMBODIMENT 9. The method of example embodiment 8, wherein the first voltage is a stepped-down voltage of the supply voltage.

EXAMPLE EMBODIMENT 10. The method of example embodiment 9, comprising stepping-down the supply voltage, using a level shifter of the redundancy logic circuit, based on receiving the supply voltage to provide the first voltage.

EXAMPLE EMBODIMENT 11. The method of example embodiment 10, comprising selecting the stepped-down supply voltage, using a multiplexer of the redundancy logic sector, based on stepping-down the supply voltage to provide the first voltage.

EXAMPLE EMBODIMENT 12. The method of example embodiment 8, wherein the first voltage and the second voltage are a stepped-down voltage of the supply voltage, and wherein the first voltage is different from the second voltage.

EXAMPLE EMBODIMENT 13. The method of example embodiment 8, wherein the redundancy logic circuit is disposed between the first portion of programmable logic sectors and the second portion of programmable logic sectors of the plurality of programmable logic sectors.

EXAMPLE EMBODIMENT 14. The method of example embodiment 8, wherein the redundancy logic circuit provides the first voltage to the first portion of programmable logic sectors via a first voltage rail and provides the second voltage to the second portion of programmable logic sectors via a second voltage rail.

EXAMPLE EMBODIMENT 15. An FPGA comprising:
a power supply;
a first plurality of programmable logic sectors that implement a first logic configuration using a first voltage level;
a second plurality of programmable logic sectors that implements a second logic configuration using a second voltage level; and
a redundancy logic circuit that repairs the first and second plurality of programmable logic sectors, provides the first voltage level, and provides the second voltage level based on receiving a supply voltage from the power supply, wherein the first and second voltage levels are different from each other.

EXAMPLE EMBODIMENT 16. The FPGA of example embodiment 15, wherein the redundancy logic circuit comprises: a first level shifter that receives the supply voltage and steps-down the supply voltage to the first voltage level.

EXAMPLE EMBODIMENT 17. The FPGA of example embodiment 15, wherein the redundancy logic circuit comprises: a second level shifter that receives the supply voltage and steps-down the supply voltage to the second voltage level.

EXAMPLE EMBODIMENT 18. The FPGA of example embodiment 15, comprising a first voltage rail that provides the first voltage level to the first plurality of the programmable logic sectors and a second voltage rail that provides the second voltage to the second plurality of the programmable logic sectors.

EXAMPLE EMBODIMENT 19. The FPGA of example embodiment 15, wherein the first plurality of programmable logic sectors operates according to a first operating frequency that corresponds to the first voltage level, the second plurality of programmable logic sectors operates according to a second operating frequency that corresponds to the second voltage level, the second voltage level is lower than the second voltage level, and the second operating frequency is lower than the first operating frequency.

EXAMPLE EMBODIMENT 20. The FPGA of example emodiment 15, wherein the first logic configuration is configured to use the first voltage level, and the second logic configuration is configured to use the second voltage level.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A programmable logic device, comprising:
a plurality of programmable logic sectors, wherein each programmable logic sector comprises at least one programmable logic element;
a redundancy logic circuit coupled to the programmable logic sectors for providing a first voltage to a first portion of the programmable logic sectors of the plurality of programmable logic sectors and a second voltage to a second portion of the programmable logic sectors of the plurality of programmable logic sectors, wherein the redundancy logic circuit comprises:
a first level shifter that receives a supply voltage and steps-down the supply voltage to the first voltage; and
multiplexer circuitry that comprises a first multiplexer that remaps logic of a first programmable logic element of the at least one programmable logic element associated with the first portion of the programmable logic sectors to utilize a redundant programmable logic element using the first voltage.

2. The programmable logic device of claim 1, wherein the multiplexer circuitry comprises a second multiplexer that selects the supply voltage for providing the second voltage to the second portion of the programmable logic sectors.

3. The programmable logic device of claim 1, wherein the first level shifter receive control bits and steps-down the supply voltage to the first voltage based on the control bits.

4. The programmable logic device of claim 1, wherein:
the redundancy logic circuit comprises a second level shifter that receives the supply voltage and control bits;
steps-down the supply voltage to the second voltage based on the control bits; and
the multiplexer circuitry remaps logic of a second programmable logic element of the at least one programmable logic element associated with the second portion of the programmable logic sectors to utilize a redundant programmable logic element using the second voltage.

5. The programmable logic device of claim 1, comprising a first voltage rail that provides the first voltage to the first portion of the programmable logic sectors and a second voltage rail that provides the second voltage to the second portion of the programmable logic sectors.

6. The programmable logic device of claim 1, wherein the programmable logic elements of the first portion of the programmable logic sectors implement at least a first logic configuration, and the programmable logic elements of the second portion of the programmable logic sectors implement at least a second logic configuration.

7. The programmable logic device of claim 6, wherein the first logic configuration performs functions using the first voltage, and the second logic configuration performs functions using the second voltage.

8. A method comprising:
receiving, by a redundancy logic circuit that performs repairs for a programmable logic device and from a power supply, a supply voltage;
providing, via the redundancy logic circuit, a first voltage to a first portion of programmable logic sectors of a plurality of programmable logic sectors of the programmable logic device based on receiving the supply voltage; and
providing, via the redundancy logic circuit, a second voltage to a second portion of programmable logic sectors of the plurality of programmable logic sectors based on receiving the supply voltage.

9. The method of claim 8, wherein the first voltage is a stepped-down voltage of the supply voltage.

10. The method of claim 9, comprising stepping-down the supply voltage, using a level shifter of the redundancy logic circuit, based on receiving the supply voltage to provide the first voltage.

11. The method of claim 10, comprising selecting the stepped-down voltage, using a multiplexer of the redundancy logic circuit, based on stepping-down the supply voltage to provide the first voltage.

12. The method of claim 8, wherein the first voltage and the second voltage are a stepped-down voltage of the supply voltage, and wherein the first voltage is different from the second voltage.

13. The method of claim 8, wherein the redundancy logic circuit is disposed between the first portion of programmable logic sectors and the second portion of programmable logic sectors of the plurality of programmable logic sectors.

14. The method of claim 8, wherein the redundancy logic circuit provides the first voltage to the first portion of programmable logic sectors via a first voltage rail and provides the second voltage to the second portion of programmable logic sectors via a second voltage rail.

15. An FPGA comprising:
a power supply;
a first plurality of programmable logic sectors that implement a first logic configuration using a first voltage level;
a second plurality of programmable logic sectors that implements a second logic configuration using a second voltage level; and
a redundancy logic circuit that repairs the first and second plurality of programmable logic sectors, provides the first voltage level, and provides the second voltage level based on receiving a supply voltage from the power supply, wherein the first and second voltage levels are different from each other.

16. The FPGA of claim 15, wherein the redundancy logic circuit comprises: a first level shifter that receives the supply voltage and steps-down the supply voltage to the first voltage level.

17. The FPGA of claim 15, wherein the redundancy logic circuit comprises: a second level shifter that receives the supply voltage and steps-down the supply voltage to the second voltage level.

18. The FPGA of claim 15, comprising a first voltage rail that provides the first voltage level to the first plurality of programmable logic sectors and a second voltage rail that provides the second voltage level to the second plurality of programmable logic sectors.

19. The FPGA of claim 15, wherein the first plurality of programmable logic sectors operates according to a first operating frequency that corresponds to the first voltage level, the second plurality of programmable logic sectors operates according to a second operating frequency that corresponds to the second voltage level, the second voltage level is lower than the second voltage level, and the second operating frequency is lower than the first operating frequency.

20. The FPGA of claim 15, wherein the first logic configuration is configured to use the first voltage level, and the second logic configuration is configured to use the second voltage level.

* * * * *